(12) United States Patent
Yang et al.

(10) Patent No.: US 7,888,851 B2
(45) Date of Patent: Feb. 15, 2011

(54) LED LAMP

(75) Inventors: Ri-Lang Yang, Shenzhen (CN); Guang Yu, Shenzhen (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 138 days.

(21) Appl. No.: 12/432,784

(22) Filed: Apr. 30, 2009

(65) Prior Publication Data
US 2010/0171403 A1 Jul. 8, 2010

(30) Foreign Application Priority Data
Jan. 5, 2009  (CN)  ......................... 2009 1 0300068

(51) Int. Cl.
*H05B 33/00* (2006.01)
*F21V 29/00* (2006.01)

(52) U.S. Cl. ................... 313/46; 313/512; 362/800; 362/294; 362/547

(58) Field of Classification Search .............. None
See application file for complete search history.

(56) References Cited

U.S. PATENT DOCUMENTS

| | | | | |
|---|---|---|---|---|
| 7,677,767 | B2 * | 3/2010 | Chyn | 362/294 |
| 7,784,973 | B2 * | 8/2010 | Zhang et al. | 362/294 |
| 7,806,575 | B2 * | 10/2010 | Willwohl et al. | 362/547 |
| 2009/0296418 | A1 * | 12/2009 | Luo et al. | 362/516 |
| 2010/0259935 | A1 * | 10/2010 | Scordino et al. | 362/294 |

* cited by examiner

*Primary Examiner*—Ashok Patel
(74) *Attorney, Agent, or Firm*—Frank R. Niranjan

(57) ABSTRACT

An LED lamp includes a base, at least first and second heat sinks, and at least first and second LED modules. The first heat sink includes a first heat absorbing surface and a first mounting surface which is mounted to the base, and defines axially a first through hole. The second heat sink includes a second heat absorbing surface and a second mounting surface which is mounted to the base. The second heat sink is received in the first through hole of the first heat sink. The second heat sink has a height greater than a height of the first heat sink whereby the second heat absorbing surface extends out of the first heat sink. The first and second LED modules are mounted on the first and second heat absorbing surfaces, respectively.

13 Claims, 4 Drawing Sheets

LED LAMP

BACKGROUND

1. Technical Field

The disclosure relates to an LED (light-emitting diode) lamp, and more particularly to an improved LED lamp capable of illuminating a large area.

2. Description of Related Art

An LED lamp utilizes LEDs as a source of illumination, in which current flowing in one direction through a junction region comprising two different semiconductors results in electrons and holes coupling at the junction region and generating a light beam. The LED is resistant to shock and has an almost endless lifetime under specific conditions, making it a popular, cost-effective and high quality replacement for incandescent and fluorescent lamps.

Known implementations of LED modules in an LED lamp make use of a plurality of individual LEDs to generate light that is ample and of satisfactory spatial distribution. The large number of LEDs, however, increases price and power consumption of the module. Considerable heat is also generated, which, if not adequately addressed at additional expense, impacts LED lamp reliability.

Further, since the LEDs are generally arranged on a printed circuit board having a flattened surface, illumination is distributed at a wide variety of spatial angles with sharp differences in intensity and brightness, making it unsuitable for environments requiring even and broad illumination. Finally, the LEDs mounted on the flattened surface of the printed circuit board cannot have a large area of illumination.

What is needed, therefore, is an LED lamp which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
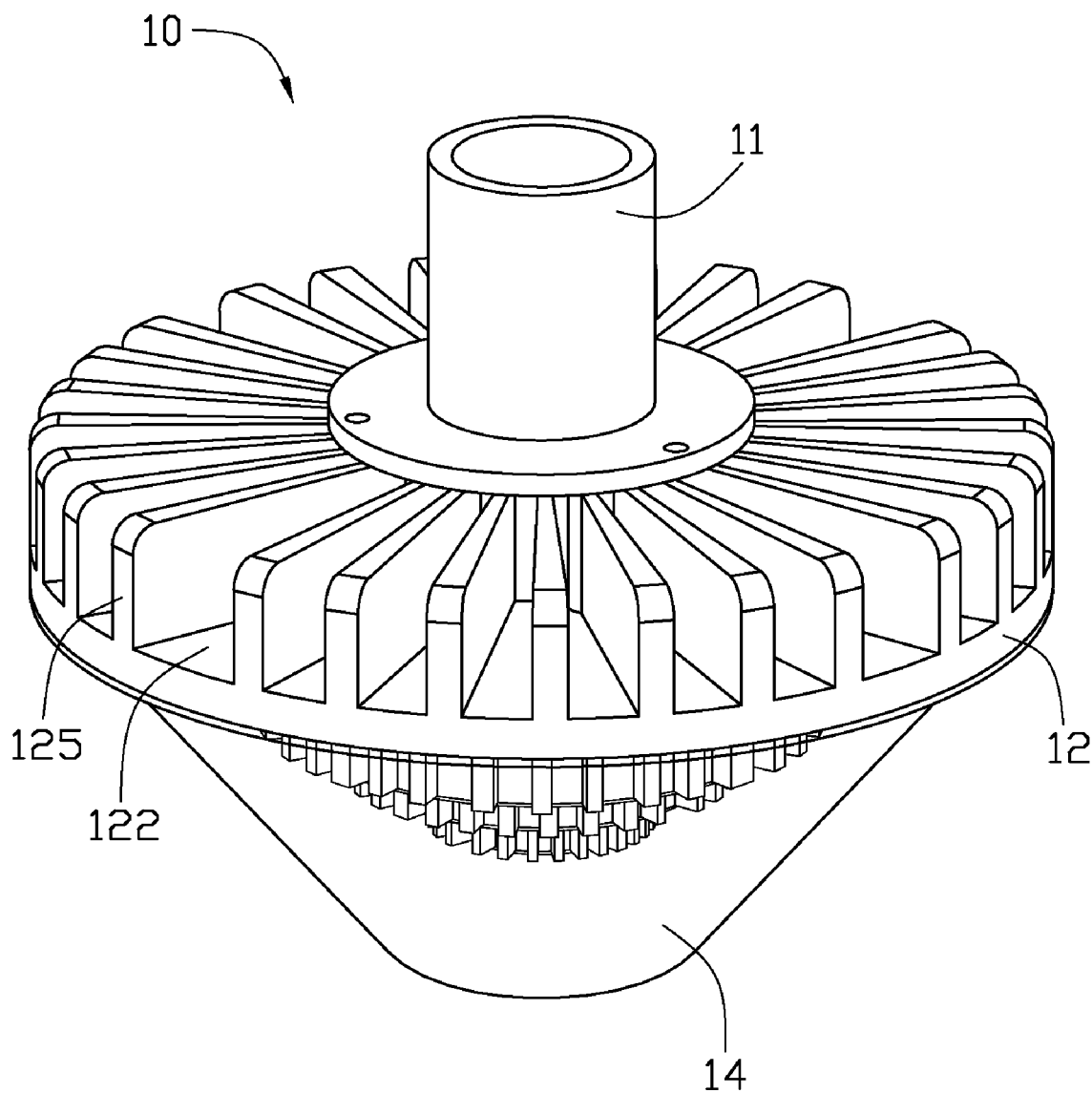
FIG. 1 is an isometric, assembled view of an LED lamp in accordance with an exemplary embodiment of the disclosure.
Figure 2:
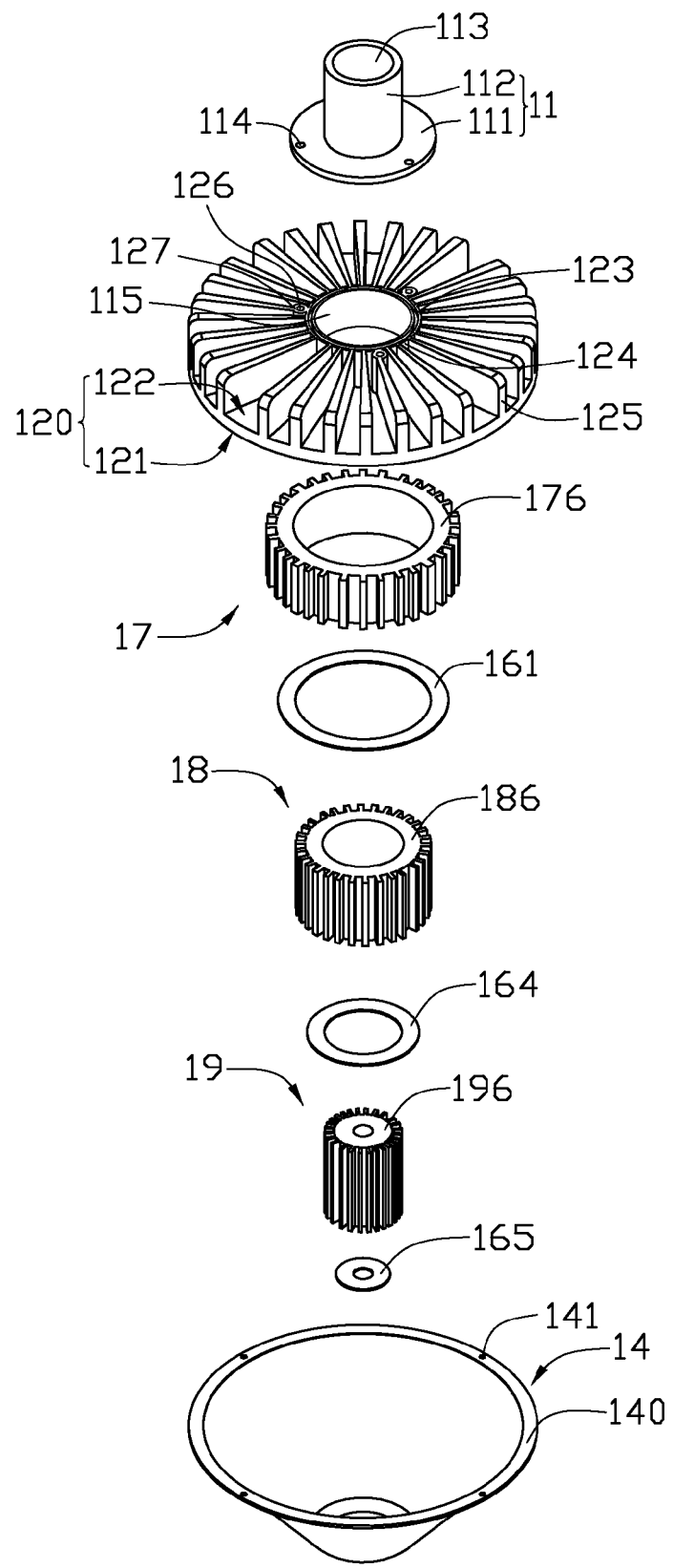
FIG. 2 is an exploded view of the LED lamp of FIG. 1.

Referring to FIGS. 1-4, an LED lamp 10 in accordance with an exemplary embodiment is illustrated. The LED lamp 10, which is configured for providing illumination indoors and outdoors, includes a base 12, a mounting member 11 coupled to a top of the base 12, a first heat sink 17, a second heat sink 18, a third heat sink 19, a first LED module 161, a second LED module 164, a third LED module 165 and a cover 14 located under the base 12. The first heat sink 17, the second heat sink 18 and the third heat sink 19 are located under and contact with a bottom surface 121 of the base 12. The first LED module 161, the second LED module 164 and the third LED module 165 correspond to and are mounted on the first heat sink 17, the second heat sink 18 and the third heat sink 19, respectively. The cover 14 engages with the bottom surface 121 of the base 12 to enclose the heat sinks 17, 18, 19 and the LED modules 161, 164, 165 therein.

Figure 3:
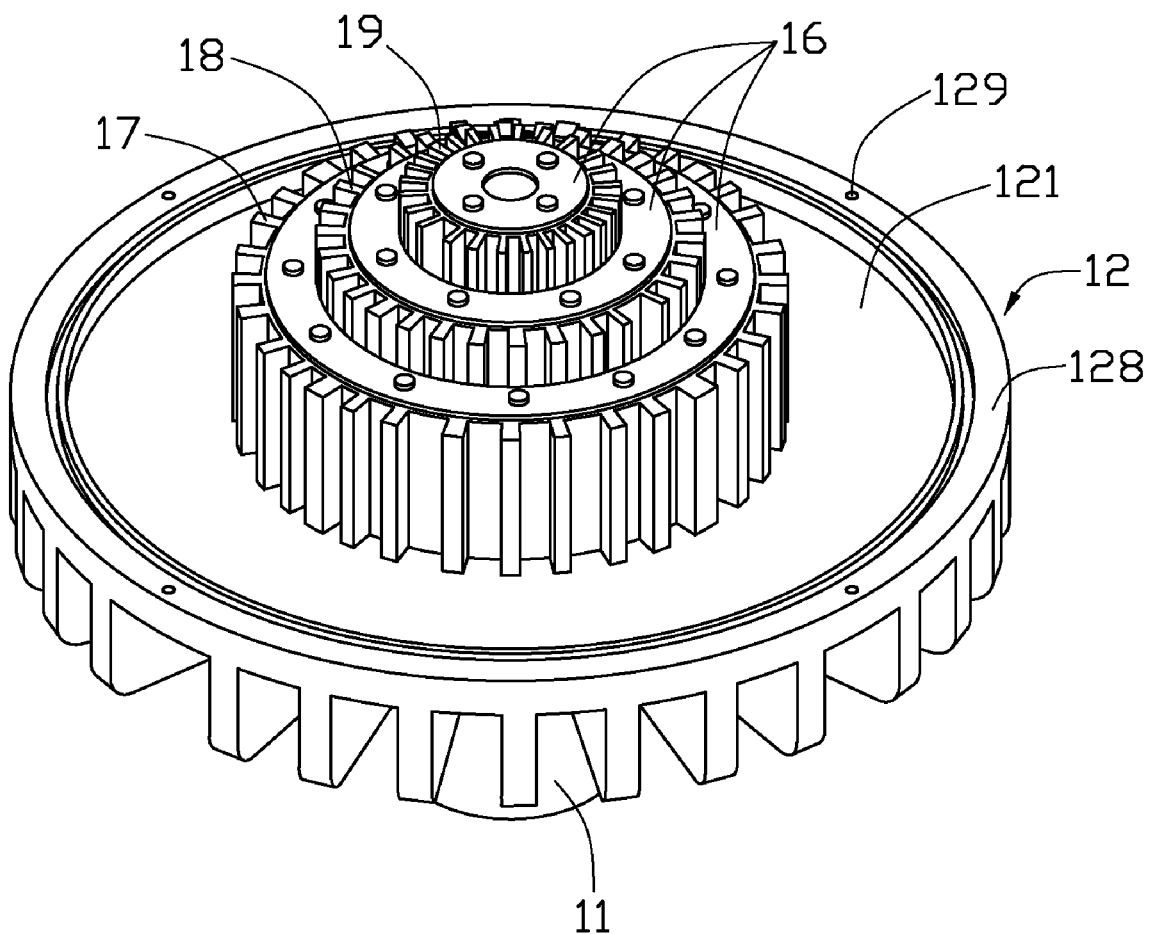
FIG. 3 is an inverted view of the LED lamp of FIG. 1, with a cover thereof removed.
Figure 4:
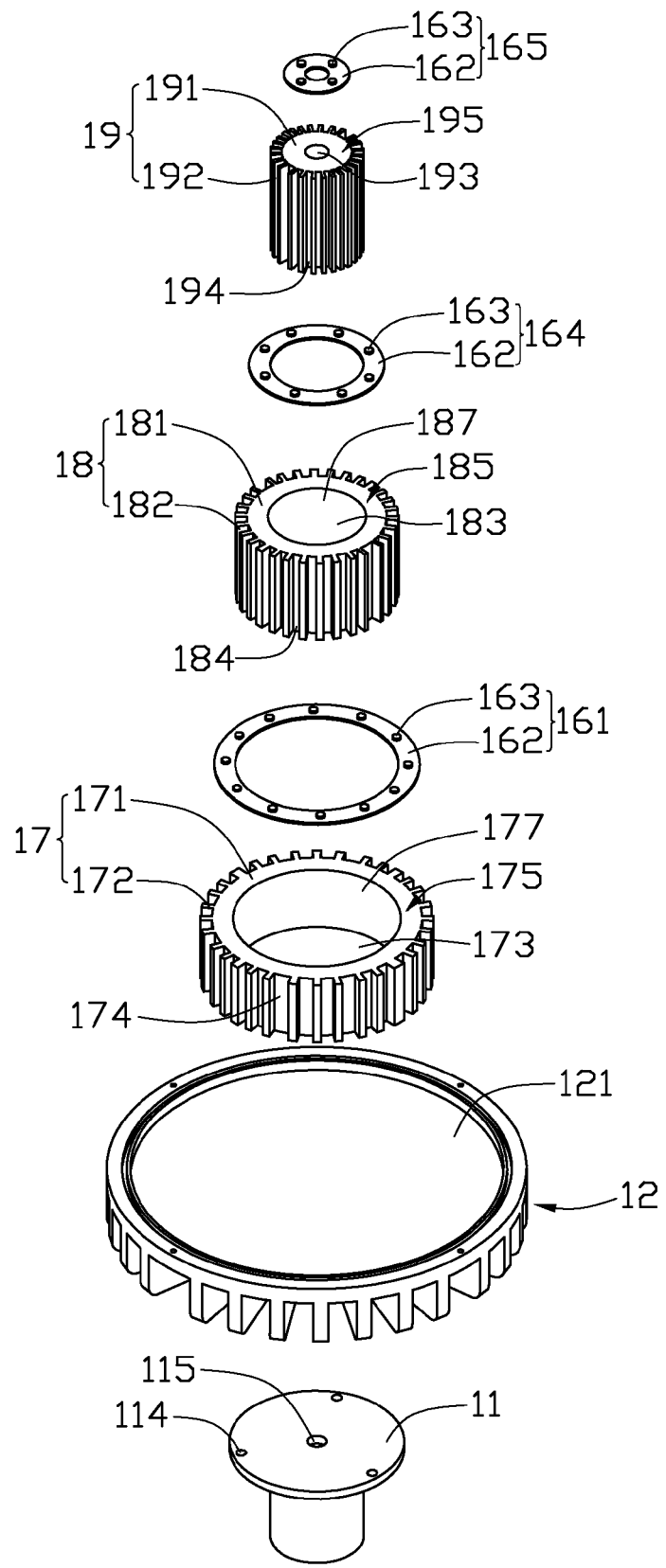
FIG. 4 is an exploded view of the LED lamp of FIG. 3.

The base 12 is made of a metal having a high heat conductivity, such as aluminum, and comprises a circular base plate 120, a receiving cylinder 123 and an annular engaging flange 128 (see FIG. 3). The base plate 120 includes an upper surface 122 and the bottom surface 121 of the base 12 opposite to the upper surface 122. The receiving cylinder 123 extends vertically upwardly from a center of the upper surface 122 of the base plate 120. The receiving cylinder 123 is perpendicular to the upper surface 122 of the base plate 120 and defines a receiving hole 115 therein for accommodating related electronic components such as selenium rectifier and controlling circuit board of the LED lamp 10. A plurality of projecting vanes 125 are arranged on the upper surface 122 of the base plate 120 around the receiving cylinder 123. The projecting vanes 125 which extend radially and outwardly from an outer circumference 124 of the receiving cylinder 123, are perpendicular to the base plate 120 and symmetrical to each other relative to the center of the base plate 120. A plurality of fixing posts 127 which extend vertically upwardly from the upper surface 122 of the base plate 120, are joined to the outer circumference 124 of the receiving cylinder 123. Each fixing post 127 defines a fixing hole 126 therein. The engaging flange 128 is located at an outer edge of the base plate 120. The engaging flange 128 defines a plurality of equidistantly engaging holes 129 in the bottom surface 121 of the base 12. The engaging holes 129 are configured for engagingly receiving screws (not shown) to secure the cover 14 on the engaging flange 128.

The mounting member 11 comprises a circular mounting plate 111 and a sleeve 112 extending vertically upwardly from a central part of a top of the mounting plate 111. The mounting plate 111 has a diameter slightly larger than that of the receiving cylinder 123 of the base 12 for mounting on an upper end of the receiving cylinder 123. A plurality of through holes 114 which are for respectively in alignment with the fixing holes 126 of the fixing posts 127 of the base 12, are defined in the mounting plate 111 and adjacent to an outer edge of the mounting plate 111. The sleeve 112 is used for engagingly receiving an end of a holding pole (not shown) in a hole 113 of the sleeve 112 to hold the LED lamp 10 in position when in use. The mounting member 11 and the base 12 are coupled together by screws extended through the through holes 114 of the mounting plate 111 and screwed into the corresponding fixing holes 126 of the fixing posts 127 of the base 12. A circular hole 115 is defined in the center of the mounting plate 111, allowing electrical wires (not shown) to extend into the LED lamp 10 to electrically connect with the LED modules 161, 164, 165.

Each heat sink 17, 18, 19 is integrally made of metallic material with high heat conductivity, such as copper or aluminum. Each heat sink 17, 18, 19 includes a column-shaped body 171, 181, 191 and a plurality of fins 172, 182, 192 radially and outwardly extending from an outer circumferential surface 174, 184, 194 of the body 171, 181, 191. The body 171 of the first heat sink 17 forms a first mounting surface 176 at a top side thereof and a first heat absorbing surface 175 at a bottom side thereof, opposite to the first mounting surface 176. The first heat sink 17 defines axially a first through hole 173 which extends from the first heat absorbing surface 175 to the first mounting surface 176. The first mounting surface 176 is located under and contacts with the bottom surface 121 of the base plate 120. The body 181 of the second heat sink 18 includes a second mounting surface 186 at a top side thereof and a second heat absorbing surface 185 at a bottom side thereof, opposite to the second mounting surface 186. The second heat sink 18 defines axially a second through hole 183 which extends from the second heat absorbing surface 185 to the second mounting surface 186. The second heat sink 18 is received in the first through hole 173 of the first heat sink 17. The second mounting surface 186 is located under and contacts with the bottom surface 121 of the base plate 120. The second heat sink 18 has a height greater than a height of the first heat sink 17, so that the second heat absorbing surface 185 extends out of the first heat sink 17 when the second heat sink 18 is mounted in the first through hole 173 of the first heat sink 17, and is located below the first heat absorbing surface 175. The first through hole 173 of the first heat sink 17 has a bore diameter larger than an outer diameter of the second heat sink 18, and the fins 182 of the second heat sink 18 space from an inner wall 177 of the first heat sink 17 defining the first through hole 173. The body 191 of the third heat sink 19 includes a third mounting surface 196 at a top side thereof and a third heat absorbing surface 195 at a bottom side thereof, opposite to the third mounting surface 196. The third heat sink 19 defines axially a third through hole 193 which extends from the third heat absorbing surface 195 to the third mounting surface 196. The third heat sink 19 is received in the second through hole 183 of the second heat sink 18. The third mounting surface 196 is located under and contacts with the bottom surface 121 of the base plate 120. The third heat sink 19 has a height greater than a height of the second heat sink 18, so that the third heat absorbing surface 195 extends out of the second heat sink 18 when the third heat sink 19 is mounted in the second through hole 183 of the second heat sink 18, and is located under the second heat absorbing surface 185. The second through hole 183 of the second heat sink 18 has a bore diameter larger than an outer diameter of the third heat sink 19, and the fins 192 of the third heat sink 19 space from an inner wall 187 of the second heat sink 18 defining the second through hole 183.

Each LED module 161, 164, 165 comprises an annular printed circuit board 162 and a plurality of LED components 163 arranged thereon. The printed circuit board 162 of the first LED module 161 is attached to the first heat absorbing surface 175 of the first heat sink 17. The printed circuit board 162 of the second LED module 164 is attached to the second heat absorbing surface 185 of the second heat sink 18. The printed circuit board 162 of the third LED module 165 is attached to the third heat absorbing surface 195 of the third heat sink 19.

The cover 14 has a shape of a frustum and is made of transparent/translucent plastic or glass material. An annular flange 140 extends outwards and horizontally from a top end of the cover 14 and has a shape and size consistent with that of the engaging flange 128 of the base 12. A plurality of extending holes 141, which are for respectively in alignment with the engaging holes 129 of the engaging flange 128, are defined in the annular flange 140. The cover 14 is coupled to the base 12 by screws extended through the extending holes 141 of the annular flange 140 and screwed into the engaging holes 129 of the engaging flange 128 of the base 12.

In use, the first, second and third LED modules 161, 164, 165 are located at different levels along a direction from the base 12 to the cover 14. Therefore, light generated by the LED lamp 10 can be directed to different orientations of the LED lamp 10 and evenly distributed, without local concentration. The LED lamp 10 is thus able to meet a specified requirement of use. Furthermore, each LED module 161, 164, 165 is directly and independently attached to the corresponding heat sink 17, 18, 19; moreover, each heat sink 17, 18, 19 is directly attached to the base 12. The heat generated by the LED modules 161, 164, 165 is timely absorbed by the corresponding heat sink 17, 18, 19 and distributed evenly over the fins 172, 182, 192 and the projecting vanes 125 to dissipate into ambient air.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp comprising:
 a base;
 a first heat sink comprising a first heat absorbing surface at one end and a first mounting surface at another end opposite to the first heat absorbing surface, the first mounting surface being mounted to the base, the first heat sink defining axially a first through hole, the first through hole extending from the first heat absorbing surface to the first mounting surface;
 a second heat sink comprising a second heat absorbing surface at one end and a second mounting surface at another end opposite to the second heat absorbing surface, the second mounting surface being mounted to the base, the second heat sink being received in the first through hole of the first heat sink, the second heat sink having a height greater than a height of the first heat sink whereby the second heat absorbing surface extends out of the first heat sink;
 a first LED module mounted on the first heat absorbing surface; and
 a second LED module mounted on the second heat absorbing surface.

2. The LED lamp as claimed in claim 1, wherein each of the first and second heat sinks comprises a column-shaped body and a plurality of fins extending outwardly and radially from the body, and the first through hole is defined in the body of the first heat sink.

3. The LED lamp as claimed in claim 2 further comprising a third heat sink and a third LED module, wherein the third heat sink comprises a third heat absorbing surface at one end and a third mounting surface at another end opposite to the third heat absorbing surface, the third mounting surface being mounted to the base, the third LED module being mounted on the third heat absorbing surface, the second heat sink defining axially a second through hole, the second through hole extending from the second heat absorbing surface to the second mounting surface, the third heat sink being received in the second through hole, the third heat sink having a height greater than the height of the second heat sink whereby the third heat absorbing surface extends out of the second heat sink.

4. The LED lamp as claimed in claim 3, wherein the third heat sink comprises a column-shaped body and a plurality of fins extending outwardly and radially from the body of the third heat sink, the second through hole is defined in the body of the second heat sink.

5. The LED lamp as claimed in claim 2, wherein the first through hole of the first heat sink has a bore diameter larger than an outer diameter of the second heat sink, the fins of the second heat sink spacing from an inner wall of the first heat sink defining the first through hole.

6. The LED lamp as claimed in claim 1, wherein the base is made of heat conductive material, the base comprising a base plate and a plurality of projecting vanes, the base plate comprising an upper surface and a bottom surface opposite to the upper surface, the projecting vanes being arranged on the upper surface of the base plate, the first heat sink and the second heat sink being mounted to the bottom surface of the base plate.

7. The LED lamp as claimed in claim 6, wherein the base forms a receiving cylinder extending upwardly from a central portion of the upper surface of the base plate, the receiving cylinder defining a receiving hole therein, the projecting vanes of the base extending outwardly and radially from an outer circumference of the receiving cylinder.

8. The LED lamp as claimed in claim 7 further comprising a mounting member, wherein the mounting member comprises a mounting plate and a sleeve extending upwardly from the mounting plate, the mounting plate engaging with an upper end of the receiving cylinder.

9. The LED lamp as claimed in claim 8 further comprising a cover, wherein the cover is mounted to the base and encloses the first heat sink and the second heat sink therein, the first heat absorbing surface and the second heat absorbing surface facing the cover.

10. The LED lamp as claimed in claim 1, wherein each of the first and second LED modules comprises an annular printed circuit board and a plurality of LED components mounted on the printed circuit board and spaced from each other, the printed circuit board of the first LED module being mounted on the first heat absorbing surface, the printed circuit board of the second LED module being mounted on the second heat absorbing surface.

11. The LED lamp as claimed in claim 1 further comprising a third heat sink and a third LED module, wherein the third heat sink comprises a third heat absorbing surface at one end and a third mounting surface at another end opposite to the third heat absorbing surface, the second heat sink defining axially a second through hole, the second through hole extending from the second heat absorbing surface to the second mounting surface, the third heat sink being received in the second through hole of the second heat sink, the third mounting surface being mounted to the base, the third heat sink having a height greater than the height of the second heat sink whereby the third heat absorbing surface extends out of the second heat sink, the third LED module being mounted on the third heat absorbing surface.

12. The LED lamp as claimed in claim 11, wherein the second heat sink comprises a column-shaped body and a plurality of fins extending outwardly and radially from the body of the second heat sink, the second through hole being defined in the body of the second heat sink.

13. The LED lamp as claimed in claim 11, wherein the third heat sink comprises a column-shaped body and a plurality of fins extending outwardly and radially from the body of the third heat sink, the second through hole of the second heat sink has a bore diameter larger than an outer diameter of the third heat sink, and the fins of the third heat sink space from an inner wall of the second heat sink defining the second through hole.

* * * * *